US012809445B2

(12) United States Patent
Solomon

(10) Patent No.: US 12,809,445 B2
(45) Date of Patent: Nov. 24, 2026

(54) ACTIVE POWER MANAGEMENT OF SRAM

(71) Applicant: Microchip Technology Incorporated, Chandler, AZ (US)

(72) Inventor: Robin Jonah Solomon, Chennai (IN)

(73) Assignee: Microchip Technology Incorporated, Chandler, AZ (US)

( * ) Notice: Subject to any disclaimer, the term of this patent is extended or adjusted under 35 U.S.C. 154(b) by 116 days.

(21) Appl. No.: 19/037,941

(22) Filed: Jan. 27, 2025

(65) Prior Publication Data

US 2025/0244818 A1 Jul. 31, 2025

(30) Foreign Application Priority Data

Jan. 25, 2024 (IN) ............................. 202441005129

(51) Int. Cl.

| | |
|---|---|
| ***G06F 1/32*** | (2019.01) |
| ***G06F 1/3225*** | (2019.01) |
| ***G06F 1/3234*** | (2019.01) |
| ***G11C 5/14*** | (2006.01) |

(52) U.S. Cl.

CPC .......... *G06F 1/3275* (2013.01); *G06F 1/3225* (2013.01); *G11C 5/148* (2013.01)

(58) Field of Classification Search

CPC ..................................... G06F 1/32; G06F 9/44

See application file for complete search history.

(56) References Cited

U.S. PATENT DOCUMENTS

| | | | | |
|---|---|---|---|---|
| 2013/0088932 | A1* | 4/2013 | Yamagami ............... | G11C 5/14 365/203 |
| 2017/0194756 | A1* | 7/2017 | Chang .................. | H01R 25/003 |
| 2021/0024181 | A1 | 1/2021 | Kestin Cohen | |

OTHER PUBLICATIONS

International Search Report & Written Opinion issued on Apr. 22, 2025, in corresponding International Application No. PCT/US2025/013224 (14 pages).

* cited by examiner

*Primary Examiner* — Keshab R Pandey

(74) *Attorney, Agent, or Firm* — Shumaker, Loop & Kendrick, LLP; Ryan M. Corbett; Andrew P. Stevens

(57) ABSTRACT

An apparatus for power management of a static random access memory (SRAM) bank is provided. The apparatus may include a memory core to store data, a memory peripheral connected to the memory core for supporting memory operations, a core power pin connected to a power source to supply power to the memory core, a peripheral power pin connected to the power source via a power switch, the power switch to selectively gate power to the memory peripheral, an isolation cell connected to one or more data pins of the SRAM bank, the isolation cell to isolate the data pins when the memory peripheral is powered down, and power management circuitry to monitor access patterns of the SRAM bank, determine how frequently the SRAM bank is accessed, and place the SRAM bank in deep retention mode by controlling the power switch and the isolation cell.

20 Claims, 5 Drawing Sheets

ACTIVE POWER MANAGEMENT OF SRAM

CROSS-REFERENCE TO RELATED APPLICATION

The present application claims priority to Indian Provisional Patent Application No. 202441005129, filed on Jan. 25, 2024, the contents of which are hereby incorporated by reference in their entirety.

TECHNOLOGICAL FIELD

The present disclosure relates generally to semiconductor memory and, in particular, to active power management of static random-access memory (SRAM).

BACKGROUND

Semiconductor memory plays a pivotal role in modern electronic devices, serving as a fundamental component for storing and retrieving data in various applications. Unlike traditional forms of memory, semiconductor memory relies on integrated circuits composed of semiconductor materials to store information. Semiconductor memory is integral to the functionality of microprocessors, microcontrollers, and other electronic systems, offering a solution for rapid and efficient data storage within the realm of integrated circuit design.

One important type of semiconductor memory is static random-access memory (SRAM). SRAM is valued for its speed and simplicity, using latching circuitry to store data without constant refreshing. Its static nature allows for faster access times compared to dynamic memory types.

Notwithstanding its many benefits, SRAM consumes significant static power at lower geometries. If the address and data pins of an SRAM change, they consume significant power, even if a particular SRAM is not selected. Some SRAM designs include an arrangement of a number of SRAM banks (also referred to as SRAM blocks), but not all of those SRAM banks are accessed at the same time. Some of the SRAM banks are expected to be frequently accessed while others may be seldom accessed. Uses of SRAM in some electronic systems, including those in which the SRAM is used to store a decrypted version of an application image, may retain the content in all of the SRAM banks so that the decrypted version of the application is not lost.

BRIEF SUMMARY

Examples of the present disclosure are directed to semiconductor memory and, in particular, to active power management of static random-access memory (SRAM). The active power management of one or more examples operates to save power by putting seldom accessed SRAM banks in a deep retention mode, and power gating peripheral power of the SRAM bank, while leaving the memory core of the SRAM banks powered to retain the charge/value. Various features, aspects, and advantages of the present disclosure will be apparent from a reading of the following detailed description together with the accompanying figures, which are briefly described below.

According to an aspect of one or more examples, there is provided an apparatus for power management of a static random access memory (SRAM) bank. The apparatus may include a memory core to store data, a memory peripheral connected to the memory core for supporting memory operations, a core power pin connected to a power source to supply power to the memory core, a peripheral power pin connected to the power source via a power switch, the power switch to selectively gate power to the memory peripheral, an isolation cell connected to one or more data pins of the SRAM bank, the isolation cell to isolate the one or more data pins when the memory peripheral is powered down, and power management circuitry to monitor access patterns of the SRAM bank, determine how frequently the SRAM bank is accessed, and place the SRAM bank in deep retention mode by controlling the power switch to gate power to the memory peripheral and activating the isolation cell. The power management circuitry may include a state machine to control the power switch and the isolation cell, a down counter to track a poll time for checking access activity of the SRAM bank, and a bank power status register (BPSR) to store the power state of the SRAM bank. The state machine may compare a no activity count (NAC) to determine whether the SRAM bank has been idle for a predetermined duration, and initiate power-down or isolation operations based on a result of the comparison. The power management circuitry may also include an isolation register (ISOR) to store the isolation state of the data pins, a multiplexer to select specific SRAM banks for power management operations, and a comparator to compare a count of clock cycles since the last access to an SRAM bank to a no activity count (NAC) threshold to determine inactivity. The isolation cell may disconnect the data pins from external signals to prevent unintended data transactions when the memory peripheral is powered down. The power switch may include a fast-switching transistor to reduce latency in restoring power to the memory peripheral. The apparatus may also include memory controller logic to handle wait states during power restoration to the SRAM bank. The power management circuitry may restore power to the memory peripheral and reconnect the data pins in response to detecting an access request to the SRAM bank. The apparatus may also include counters for individual SRAM banks to store their respective last-access times. The apparatus may also include a bank power status register (BPSR) and an isolation register (ISOR) to store the power and isolation status of respective SRAM banks.

According to an aspect of one or more examples, there is provided a method of managing power of a static random access memory (SRAM) bank. The method may include monitoring access patterns of the SRAM bank using power management circuitry, determining that the SRAM bank has not been accessed for a predetermined duration, placing the SRAM bank in a deep retention mode by gating power to a memory peripheral of the SRAM bank via a power switch, and isolating one or more data pins of the SRAM bank via an isolation cell, in response to detecting an access request for the SRAM bank restoring power to the memory peripheral, reconnecting the data pins, and enabling data transactions with the SRAM bank. The method may also include maintaining a count of clock cycles since the last access to the SRAM bank, and comparing the count to a no activity count (NAC) threshold to determine inactivity. Gating power to the memory peripheral may include controlling a bank power status register (BPSR) to disable the power switch. Isolating the data pins may include controlling an isolation register (ISOR) to activate the isolation cell. The method may also include inserting a wait state into memory controller logic while power to the memory peripheral is being restored. The method may also include updating a bank power status register and an isolation register to reflect the power and isolation states of the SRAM bank. Restoring power to the memory peripheral may include enabling the power switch, waiting for the power to stabilize, and disabling the isolation cell. Reconnecting the data pins may include allowing read and write operations through the data pins of the SRAM bank. The method may also include placing additional SRAM banks in deep retention mode based on their respective access patterns. The method may also include limiting capacitance of a power rail to the memory peripheral to reduce power restoration delay.

The present disclosure includes any combination of two, three, four or more features or elements set forth in this disclosure, regardless of whether such features or elements are expressly combined or otherwise recited in a specific example described herein. This disclosure is intended to be read holistically such that any separable features or elements of the disclosure, in any of its aspects and examples, is not to be viewed as combinable unless the context of the disclosure clearly dictates otherwise.

The present disclosure is provided merely for purposes of summarizing one or more examples so as to provide a basic understanding of some aspects of the disclosure. Accordingly, it will be appreciated that the described examples are merely examples and are not to be construed to narrow the scope or spirit of the disclosure in any way. Other examples, aspects and advantages will become apparent from the following detailed description taken in conjunction with the accompanying figures which illustrate, by way of example, the principles of some described examples.

BRIEF DESCRIPTION OF THE FIGURE(S)

Having thus described examples of the disclosure in general terms, reference will now be made to the accompanying figures, which are not necessarily drawn to scale, and wherein:

DETAILED DESCRIPTION

Figure 1:
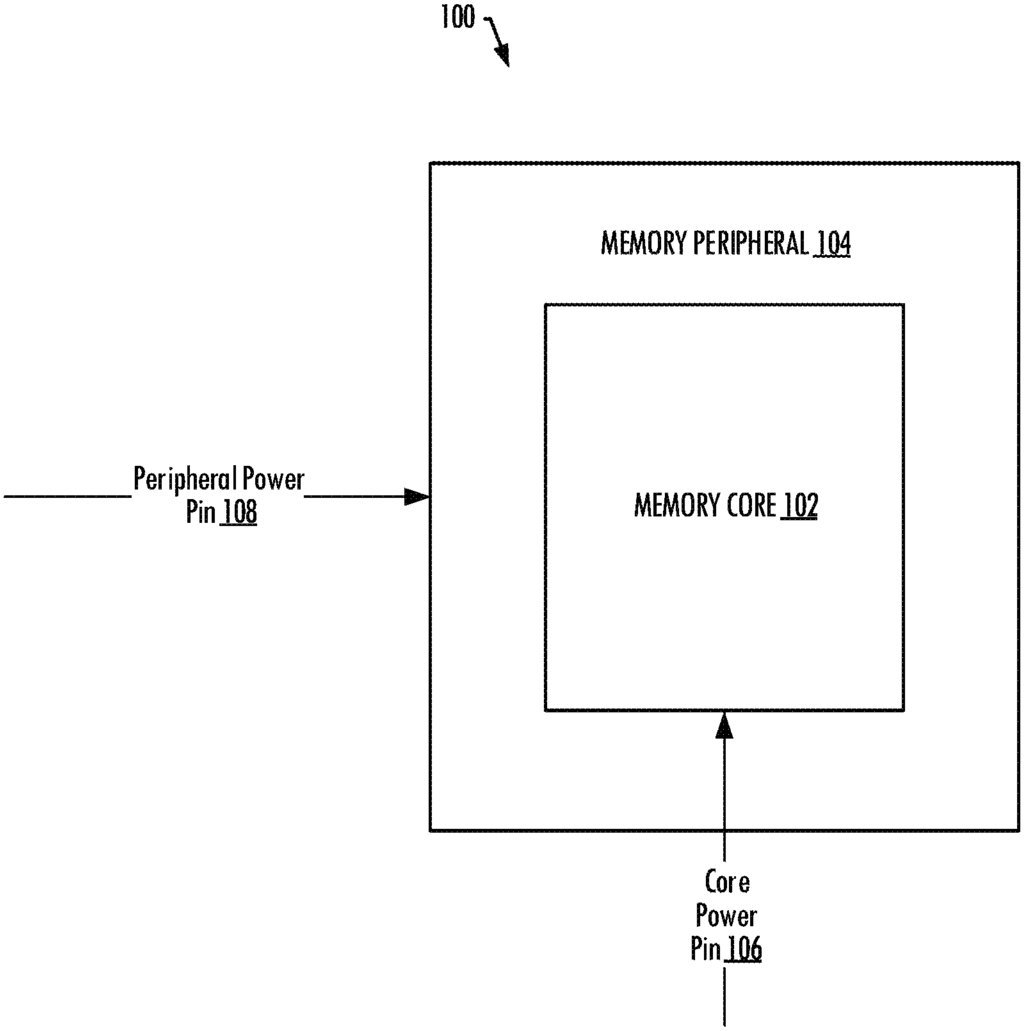
FIG. 1 is a block diagram of a static random-access memory (SRAM) bank, according to one or more examples of the present disclosure.

Some examples of the present disclosure will now be described more fully hereinafter with reference to the accompanying figures, in which some, but not all examples of the disclosure are shown. Indeed, various examples of the disclosure may be embodied in many different forms and are not to be construed as limited to the examples set forth herein; rather, these examples are provided so that this disclosure will be thorough and complete, and will fully convey the scope of the disclosure to those skilled in the art. Like reference numerals refer to like elements throughout.

Unless specified otherwise or clear from context, references to first, second or the like are not to be construed to imply a particular order. A feature described as being above another feature (unless specified otherwise or clear from context) may instead be below, and vice versa; and similarly, features described as being to the left of another feature else may instead be to the right, and vice versa. Also, while reference may be made herein to quantitative measures, values, geometric relationships or the like, unless otherwise stated, any one or more if not all of these may be absolute or approximate to account for acceptable variations that may occur, such as those due to engineering tolerances or the like.

As used herein, unless specified otherwise or clear from context, the "or" of a set of operands is the "inclusive or" and thereby true if one or more of the operands is true, as opposed to the "exclusive or" which is false when all of the operands are true. Thus, for example, "[A] or [B]" is true if [A] is true, or if [B] is true, or if both [A] and [B] are true. Further, the articles "a" and "an" mean "one or more," unless specified otherwise or clear from context to be directed to a singular form. Furthermore, it is to be understood that unless otherwise specified, the terms "data," "content," "digital content," "information," and similar terms may be at times used interchangeably.

Examples of the present disclosure relate generally to semiconductor memory and, in particular, to active power management of static random-access memory (SRAM). Again, SRAM is a type of semiconductor memory that uses latching circuitry to store data without constant refreshing. An SRAM bank refers to a section or block of Static Random-Access Memory (SRAM) within an integrated circuit. In many electronic devices, especially in microprocessors and other complex systems, SRAM is organized into banks to efficiently manage the storage and retrieval of data. Each SRAM bank typically includes a specific number of SRAM cells along with control circuitry.

FIG. 1 is a block diagram of an SRAM bank 100 (also referred to as an SRAM block), according to one or more examples of the present disclosure. As shown, the SRAM bank can be divided into a memory core 102 and a memory peripheral 104. The memory core is the central part of the SRAM, where the actual data is stored. The memory core is made up of an array of two-dimensional bit cells, each bit cell of which can store one bit of data. In some examples, each bit cell is made up of six transistors arranged in a latch circuit (e.g., flip-flop) that can store a 0 or a 1 by setting appropriate voltages on gate terminals of the transistors.

The memory peripheral 104 is the circuitry that surrounds the memory core 102 and provides the memory core with support functions. In various examples, the memory peripheral includes row and column decoders, a sense amplifier and a write driver. The row and column decoders take the address of a memory location to be accessed and decodes the address into a set of signals that select an appropriate row and column of the memory array. In a read operation, the sense amplifier may detect the small voltage difference between the two states of a bit cell and amplifies the voltage difference to a full logic level to be read from the cell. In a write operation, the write driver may provide voltages to a bit cell transistors to write a 0 or a 1 to the cell.

As also shown, in some examples, the SRAM bank 100 includes a core power pin 106 to connect the memory core to a power source. The SRAM bank also includes a peripheral power pin 108, which is separate from the core power pin, to connect the memory peripheral 104 to the power source.

As explained in the Background section, an SRAM bank may consume significant static power at lower geometries. If the address and data pins of the SRAM change, they consume significant power, even if a particular SRAM is not selected. Some SRAM designs include an arrangement of a number of SRAM banks (also referred to as blocks), but not all of those banks are accessed at the same time. Some of the banks are expected to be frequently accessed while others may be seldom accessed. Uses of SRAM in some electronic systems, including those in which the SRAM is used to store a decrypted version of an application image, may retain the content in all of the banks so that the decrypted version of the application is not lost.

Examples of the present disclosure are directed to semiconductor memory and, in particular, to active power management of SRAM, such as SRAM bank 100. The active power management of one or more examples operates to save power by putting a seldom accessed SRAM bank in a deep retention mode, and power gating power to the memory peripheral 104 of the SRAM bank, while leaving the SRAM core of the SRAM bank powered to retain the charge/value. The memory peripheral may then be powered back when access to the SRAM bank is made. In this regard, a bus request for the memory may have a wait state till the SRAM bank is fully powered for retrieving data from a given address.

Figure 2:
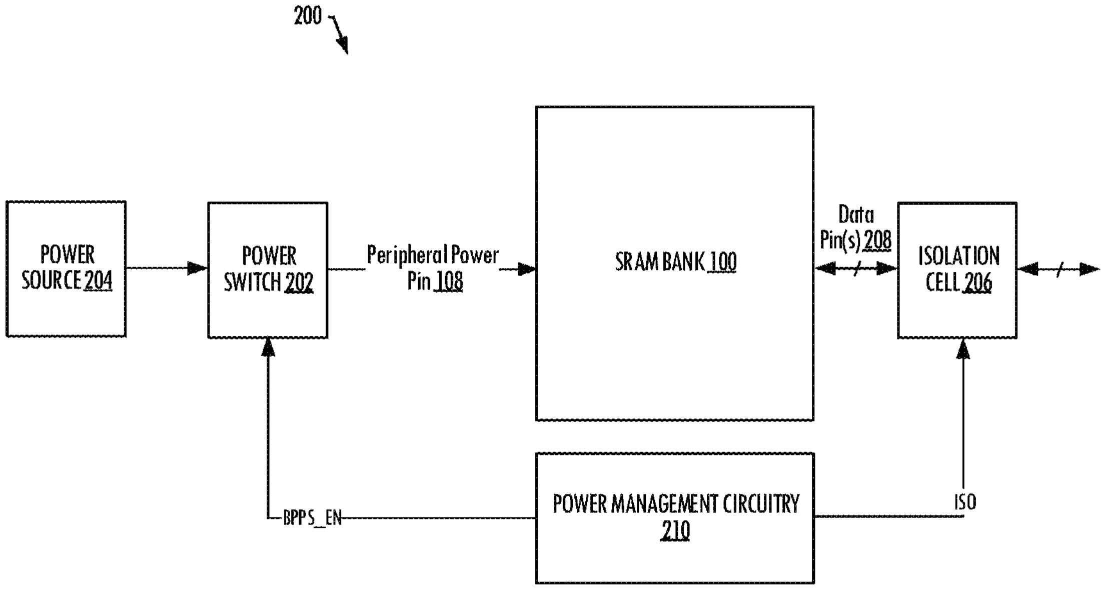
FIG. 2 is a block diagram of an apparatus to manage power of an SRAM bank, according to one or more examples.

FIG. 2 is a block diagram of an apparatus 200 to manage power of an SRAM bank 100, according to one or more examples. As shown, the apparatus includes a power switch 202 coupled to and between a power source 204 and the peripheral power pin 108 of the SRAM block, and an isolation cell 206 coupled to one or more data pins 208 of the SRAM block. As also shown, the apparatus may include power management circuitry 210 to control the power switch and isolation cell. In some examples, an SRAM may be organized into a plurality of SRAM banks, and the apparatus may include a power switch and isolation cell for respective ones of the plurality of SRAM banks. One or more of the power switch, isolation cell, or power management circuitry may be integrated with or external to the SRAM. In some examples, one or more of the power switch, isolation cell, or power management circuitry may be integrated with a memory controller that is responsible for managing and controlling operations of the SRAM.

Figure 3:
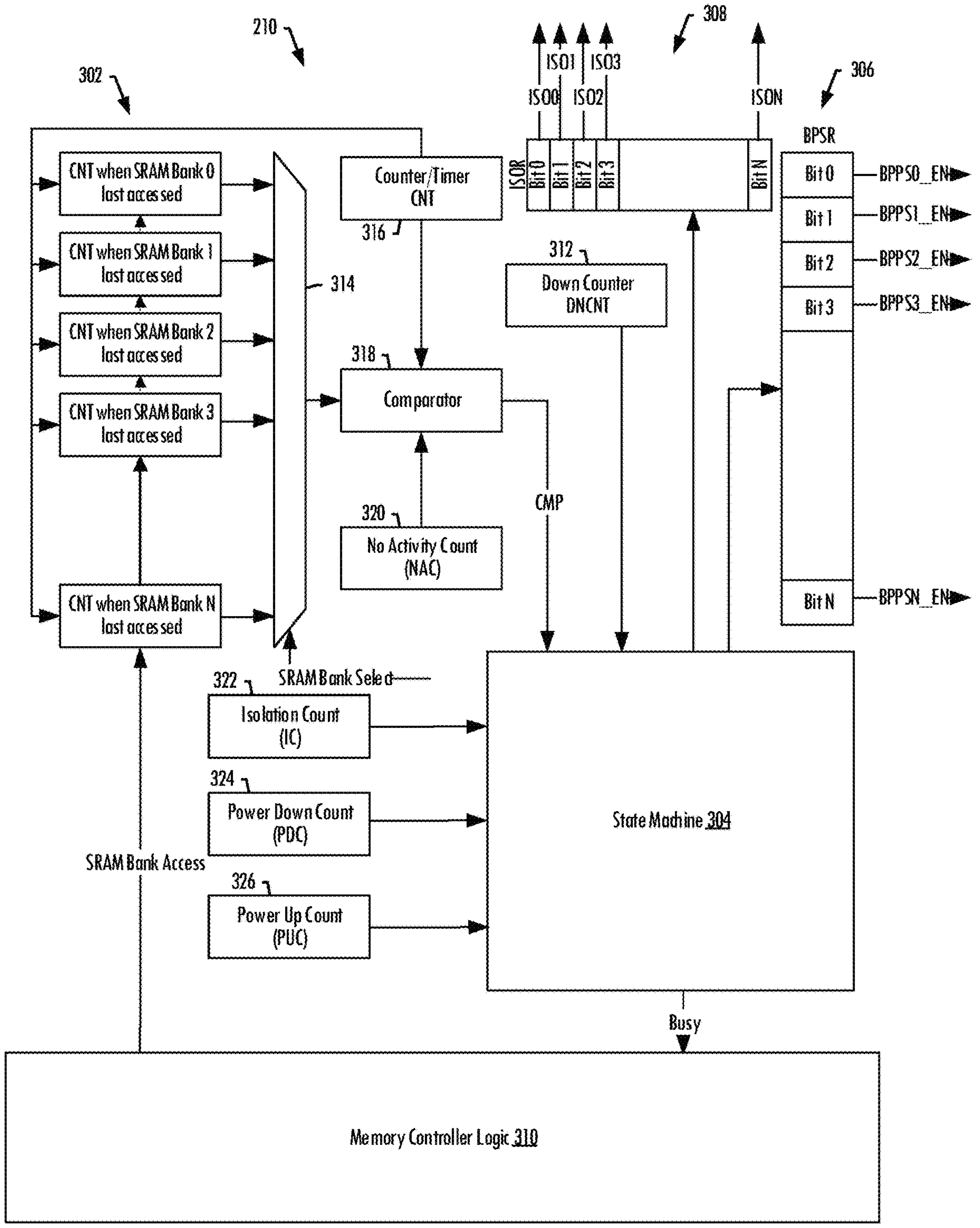
FIG. 3 is a block diagram of the power management circuitry of the apparatus of FIG. 2, according to one or more examples.

FIG. 3 is a block diagram of the power management circuitry 210 of the apparatus 200, according to one or more examples. As shown, in some examples, the power management circuitry includes registers 302 for respective SRAM banks 100 that keep track of when the SRAM banks were accessed. The power management circuitry includes a state machine 304 to make a determination that an SRAM bank has not been accessed for a predetermined/programmed amount of time; and based on the determination, the state machine may put the SRAM bank in a deep retention mode. In this regard, the state machine may set a bit of a bank power status register (BPSR) 306, which may control a respective power switch 202 to gate power to the SRAM bank's memory peripheral 104, or more particularly, the power rail of the memory peripheral. Similarly, the state machine may set a bit of an isolation register (ISOR) 308, which may control a respective isolation cell 206 to isolate the data pins 208 of the SRAM bank.

The state machine 304 may monitor the status of the SRAM banks 100 to determine when an access is made to an SRAM bank by memory controller logic 310. When an access is made to an SRAM bank in deep retention mode, the state machine may insert a wait state (busy) to the memory controller logic, and set the bit of the PBSR 306 to control the respective power switch 202 to enable power to the SRAM bank memory peripheral 104 (power rail). The state machine may wait for specified amount of time for the power to be restored to the memory peripheral and be stable, and then set the bit of the isolation register 308 to control the respective isolation cell 206 to allow a read/write memory transaction to go through the data pins 208 of the SRAM bank. By using a fast power switch and limiting capacitance on the line, the power management circuitry may allow power to the memory peripheral to be restored within a few clock pulses, thereby having low performance impact.

Figure 4:
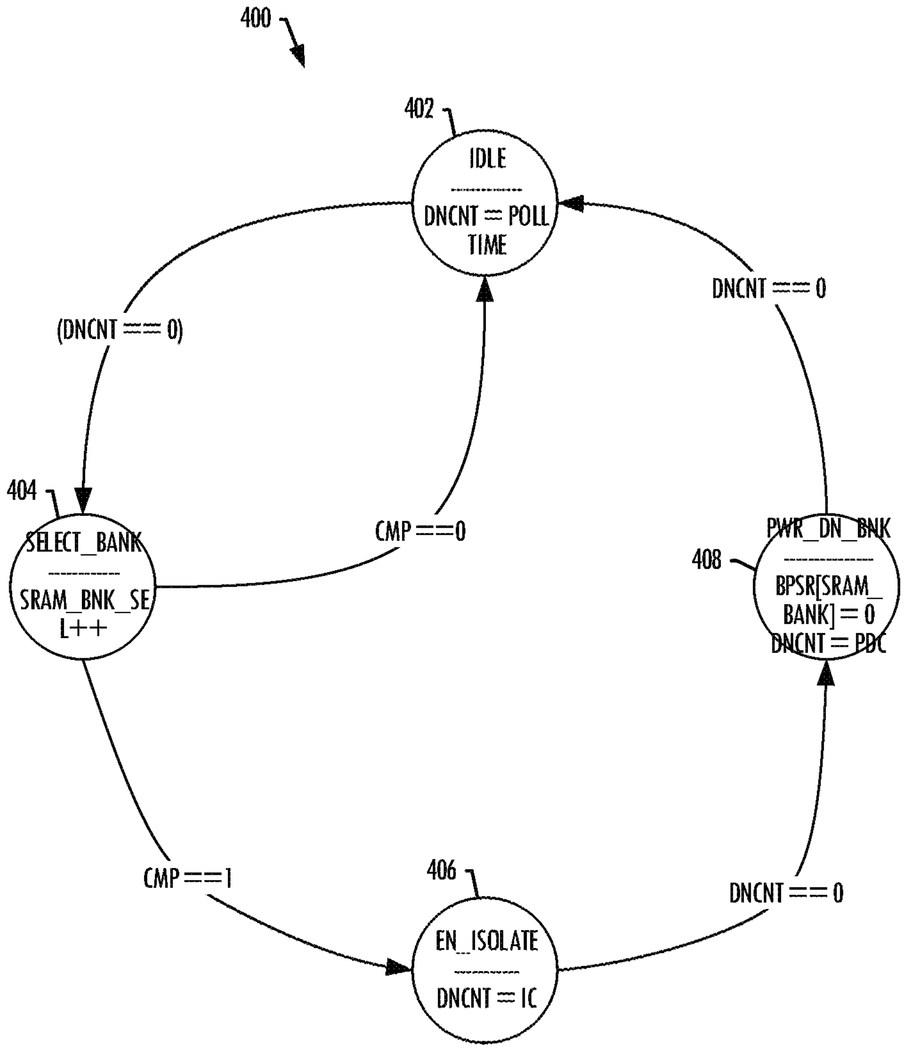
FIG. 4 is a state diagram of a sequence to power down of an SRAM bank, according to one or more examples.

FIG. 4 is a state diagram of a sequence to power down of an SRAM bank 100, which may be implemented by the state machine 304, according to one or more examples. As shown, the state machine may be in an idle state 402 with a down counter 312 (shown in FIG. 3) set to a poll time (DNCNT=Poll Time). When the down counter counts down to zero (DNCNT==0), the state machine may transition to a state 404 at which the state machine selects an SRAM bank, and determines whether the selected SRAM bank has been accessed for a predetermined/programmed amount of time.

As shown in FIG. 3, for example, the power management circuitry 210 may include a multiplexer 314 to select a register 302 in which a count (CNT) 316 of when the selected SRAM bank was last accessed is stored, and a comparator 318 to compare the count with a predetermined/programmed no activity count (NAC) 320. The comparator may output a comparison (CMP) that indicates whether the count is less than, greater than or equal to the no activity count. In some examples, the comparison may be set to a first logic value (e.g., CMP==0) to indicate the selected SRAM bank has accessed for the predetermined/programmed amount of time. In these examples, the down counter 312 may be reset, and then another SRAM bank selected (SRAM_BNK_SEL++) when the down counter reaches zero. This may repeat for the plurality of SRAM banks.

In some examples, the comparison output by the comparator 318 may be set to a second logic value (e.g., CMP==1) to indicate the selected SRAM bank 100 has not accessed for the predetermined/programmed amount of time. In these examples, the state machine 304 may transition to a state 406 in which a respective isolation cell 206 is enabled (EN_ISOLATE), and the down counter 312 is set to an isolation count 322 (shown in FIG. 3). As explained above, to enable the respective isolation cell, the state machine may set a respective bit of the isolation register 308, which may control a respective isolation cell 206 to isolate the data pins 208 of the SRAM bank.

When the down counter 312 counts down to zero (DNCNT==0), the state machine may transition to a state 408 in which the state machine may power down the SRAM bank's memory peripheral 104 (PWR_DN_BNK). In this regard, the state machine may set a respective bit of the bank power status register 306 (BPSR[SRAM_BANK]=0), which may control a respective power switch 202 to gate power to the SRAM bank's memory peripheral. The state machine may also set the down counter to a power down count 324 (shown in FIG. 3); and when the down counter counts down to zero, the state machine may return to the idle state 402.

Figure 5:
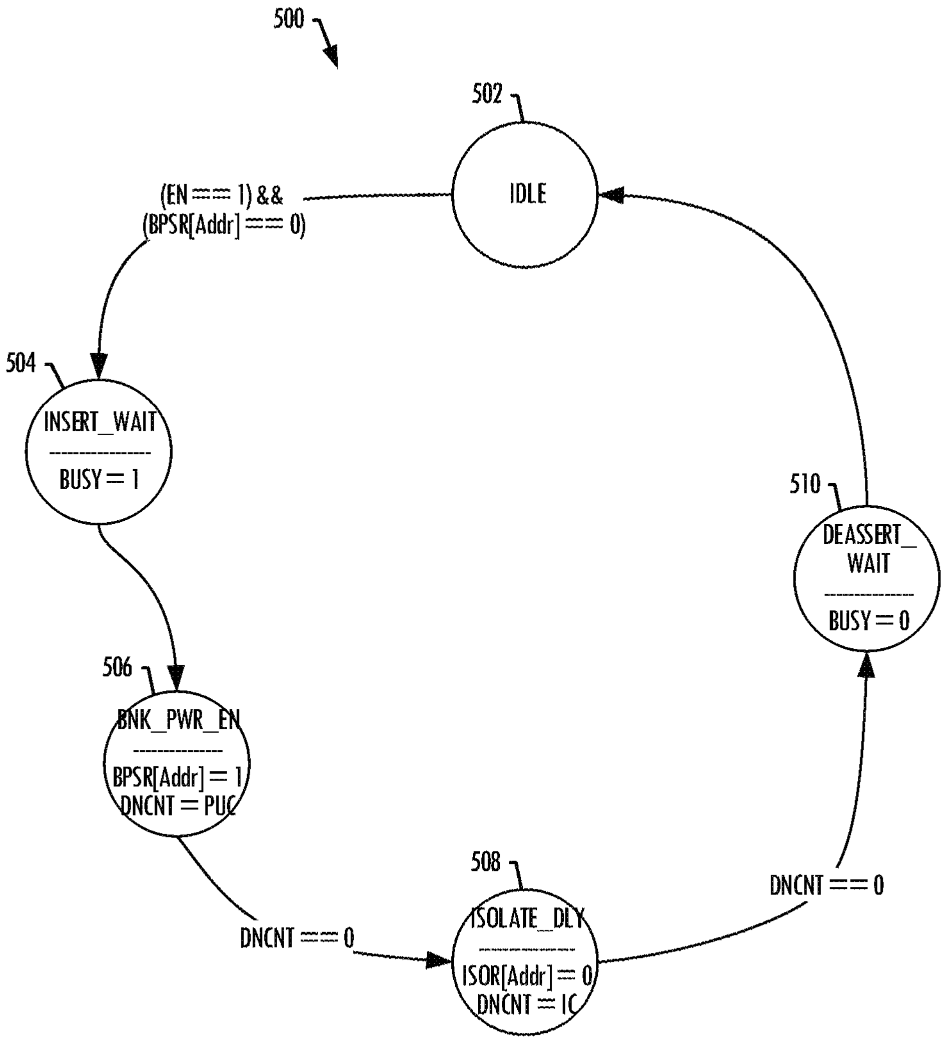
FIG. 5 is a state diagram of a sequence to power up of an SRAM bank, according to one or more examples.

FIG. 5 is a state diagram 500 of a sequence to power up of an SRAM bank 100, which may be implemented by the state machine 304, according to one or more examples. As shown, the state machine in an idle state 502 may detect an access is being made (EN==1) to an SRAM bank at an address "Addr, which is in deep retention mode (BPSR [Addr]==0). The state machine may transition to a state 504 in which the state machine may insert a wait state (BUSY=1) to the memory controller logic. The state machine may then transition to a state 506 in which the state machine may power up the SRAM bank's memory peripheral 104 (BNK_PWR_EN). In this regard, the state machine may set a respective bit of the bank power status register 306 (BPSR[Addr]=1), which may control a respective power switch 202 to gate power to the SRAM bank's memory peripheral. The state machine may also set the down counter 312 to a power up count 326 (shown in FIG. 3).

When the down counter 312 counts down to zero, the state machine 304 transition to a state 508 in which the state machine may implement an isolation delay (ISOLATE_DLY). In this state, the state machine may set the bit of the isolation register 308 (ISOR[Addr]=0) to control the respective isolation cell 206 to allow a read/write memory transaction to go through the data pins 208 of the SRAM bank. The state machine may also set the down counter to the isolation count 322; and when the down counter counts down to zero (DNCNT==0), the state machine may transition to a state 510 in which the state machine may deassert the wait state (BUSY=0) to the memory controller logic. The state machine may then transition back to the idle state 502.

Many modifications and other examples of the disclosure set forth herein will come to mind to one skilled in the art to which the disclosure pertains having the benefit of the teachings presented in the foregoing description and the associated figures. Therefore, it is to be understood that the disclosure is not to be limited to the specific examples disclosed and that modifications and other examples are intended to be included within the scope of the appended claims. Moreover, although the foregoing description and the associated figures describe examples in the context of certain example combinations of elements or functions, it is to be appreciated that different combinations of elements or functions may be provided by alternative examples without departing from the scope of the appended claims. In this regard, for example, different combinations of elements or functions than those explicitly described above are also contemplated as may be set forth in some of the appended claims. Although specific terms are employed herein, they are used in a generic and descriptive sense and not for purposes of limitation.

What is claimed is:

1. An apparatus for power management of a static random access memory (SRAM) bank, comprising:
- a memory core to store data;
- a memory peripheral connected to the memory core for supporting memory operations;
- a core power pin connected to a power source to supply power to the memory core;
- a peripheral power pin connected to the power source via a power switch, the power switch to selectively gate power to the memory peripheral;
- an isolation cell connected to one or more data pins of the SRAM bank, the isolation cell to isolate the one or more data pins when the memory peripheral is powered down; and
- power management circuitry to:
  - monitor access patterns of the SRAM bank,
  - determine how frequently the SRAM bank is accessed, and
  - place the SRAM bank in deep retention mode by controlling the power switch to gate power to the memory peripheral and activating the isolation cell.

2. The apparatus of claim 1, wherein the power management circuitry comprises:
- a state machine to control the power switch and the isolation cell;
- a down counter to track a poll time for checking access activity of the SRAM bank; and
- a bank power status register (BPSR) to store the power state of the SRAM bank.

3. The apparatus of claim 2, wherein the state machine is to:
- compare a no activity count (NAC) to determine whether the SRAM bank has been idle for a predetermined duration; and
- initiate power-down or isolation operations based on a result of the comparison.

4. The apparatus of claim 1, wherein the power management circuitry further comprises:
- an isolation register (ISOR) to store the isolation state of the data pins;
- a multiplexer to select specific SRAM banks for power management operations; and
- a comparator to compare a count of clock cycles since the last access to an SRAM bank to a no activity count (NAC) threshold to determine inactivity.

5. The apparatus of claim 1, wherein the isolation cell is to disconnect the data pins from external signals to prevent unintended data transactions when the memory peripheral is powered down.

6. The apparatus of claim 1, wherein the power switch comprises a fast-switching transistor to reduce latency in restoring power to the memory peripheral.

7. The apparatus of claim 1, further comprising memory controller logic to handle wait states during power restoration to the SRAM bank.

8. The apparatus of claim 1, wherein the power management circuitry is to restore power to the memory peripheral and reconnect the data pins in response to detecting an access request to the SRAM bank.

9. The apparatus of claim 1, further comprising counters for individual SRAM banks to store their respective last-access times.

10. The apparatus of claim 1, further comprising a bank power status register (BPSR) and an isolation register (ISOR) to store the power and isolation status of respective SRAM banks.

11. A method of managing power of a static random access memory (SRAM) bank, the method comprising:
- monitoring access patterns of the SRAM bank using power management circuitry;
- determining that the SRAM bank has not been accessed for a predetermined duration;
- placing the SRAM bank in a deep retention mode by:
  - gating power to a memory peripheral of the SRAM bank via a power switch; and
  - isolating one or more data pins of the SRAM bank via an isolation cell;
- in response to detecting an access request for the SRAM bank:
  - restoring power to the memory peripheral;
  - reconnecting the data pins; and
  - enabling data transactions with the SRAM bank.

12. The method of claim 11, further comprising:
- maintaining a count of clock cycles since the last access to the SRAM bank; and
- comparing the count to a no activity count (NAC) threshold to determine inactivity.

13. The method of claim 11, wherein gating power to the memory peripheral comprises controlling a bank power status register (BPSR) to disable the power switch.

14. The method of claim 11, wherein isolating the data pins comprises controlling an isolation register (ISOR) to activate the isolation cell.

15. The method of claim 11, further comprising inserting a wait state into memory controller logic while power to the memory peripheral is being restored.

16. The method of claim 11, further comprising updating a bank power status register and an isolation register to reflect the power and isolation states of the SRAM bank.

17. The method of claim 11, wherein restoring power to the memory peripheral comprises:

enabling the power switch;

waiting for the power to stabilize; and disabling the isolation cell.

18. The method of claim 11, wherein reconnecting the data pins comprises allowing read and write operations through the data pins of the SRAM bank.

19. The method of claim 11, further comprising placing additional SRAM banks in deep retention mode based on their respective access patterns.

20. The method of claim 11, further comprising limiting capacitance of a power rail to the memory peripheral to reduce power restoration delay.

* * * * *